US012736870B2

(12) United States Patent
Hwang et al.

(10) Patent No.: US 12,736,870 B2
(45) Date of Patent: Sep. 15, 2026

(54) METHOD OF REMOVING DEFECT OF MASK

(71) Applicant: Samsung Electronics Co., Ltd., Suwon-si (KR)

(72) Inventors: Yoonki Hwang, Suwon-si (KR); Sanghyeon Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 412 days.

(21) Appl. No.: 18/522,627

(22) Filed: Nov. 29, 2023

(65) Prior Publication Data

US 2024/0219826 A1 Jul. 4, 2024

(30) Foreign Application Priority Data

Jan. 3, 2023 (KR) ........................ 10-2023-0000896

(51) Int. Cl.

| | |
|---|---|
| ***G03F 1/72*** | (2012.01) |
| ***G01Q 30/04*** | (2010.01) |
| ***G01Q 40/02*** | (2010.01) |
| ***G01Q 60/38*** | (2010.01) |
| ***G06T 7/00*** | (2017.01) |

(52) U.S. Cl.

CPC ............... *G03F 1/72* (2013.01); *G01Q 30/04* (2013.01); *G01Q 40/02* (2013.01); *G01Q 60/38* (2013.01); *G06T 7/001* (2013.01); *G06T 2207/10061* (2013.01)

(58) Field of Classification Search

CPC .......... G03F 1/72; G01Q 30/04; G01Q 40/02; G01Q 60/38; G06T 7/001; G06T 2207/10061

See application file for complete search history.

(56) References Cited

U.S. PATENT DOCUMENTS

| | | | |
|---|---|---|---|
| 6,951,130 | B2 | 10/2005 | Hare et al. |
| 7,375,352 | B2 | 5/2008 | Takaoka et al. |
| 8,595,859 | B1 | 11/2013 | Rankl et al. |

(Continued)

FOREIGN PATENT DOCUMENTS

| | | | |
|---|---|---|---|
| KR | 10-2008-0071800 | A | 8/2008 |
| KR | 10-0873154 | B1 | 12/2008 |

(Continued)

OTHER PUBLICATIONS

Korean Notice of Allowance dated May 19, 2026 for corresponding Koreant Patent Application No. 10-2023-0000896 and its English-language translation.

*Primary Examiner* — Sean Luck

(74) *Attorney, Agent, or Firm* — Harness, Dickey & Pierce, P.L.C.

(57) ABSTRACT

A method of removing a defect of a mask may include generating a probe profile, the probe profile including characteristics of a probe of an atomic force microscope (AFM); generating a design-based reference image of a defect area by applying the probe profile to a design image of the defect area of the mask including a location of the defect; obtaining an AFM image of the defect area by scanning the defect area of the mask using the probe of the AFM; recognizing the defect as a recognized defect by comparing the AFM image of the defect area with the design-based reference image; and removing the recognized defect using the probe of the AFM.

20 Claims, 12 Drawing Sheets

(56) References Cited

U.S. PATENT DOCUMENTS

| | | | |
|---|---|---|---|
| 9,910,350 B2 | 3/2018 | Tsai et al. | |
| 9,995,763 B2 * | 6/2018 | Osborne | G01Q 10/02 |
| 10,395,362 B2 | 8/2019 | Gupta et al. | |
| 11,119,060 B2 | 9/2021 | Saraswatula et al. | |
| 2005/0172703 A1 | 8/2005 | Kley | |
| 2013/0037053 A1 | 2/2013 | Robinson et al. | |
| 2020/0310246 A1 | 10/2020 | Nakagawa et al. | |

FOREIGN PATENT DOCUMENTS

| | | |
|---|---|---|
| KR | 10-2022-0006477 A | 1/2022 |
| KR | 10-2352697 B1 | 1/2022 |
| KR | 10-2022-0031139 A | 3/2022 |

* cited by examiner

1000
AFM IMAGE DB
DESIGN DB
RECOGNIZING PROCESSOR
1300
IMAGE ANALYZING PROCESSOR
1400
IMAGE GENERATING PROCESSOR
1500
DEFECT ANALYZING PROCESSOR
1600
PBP
DRIVE CONTROLLER
1200
PROBE CONTROLLER
1210
MOVEMENT CONTROLLER
1220
MASK DEFECT INFO
PROBE DRIVING APPARATUS
1100
STAGE DRIVING APPARATUS
1150
CTLV
1720
1710
PRB
DEF
100
1900

METHOD OF REMOVING DEFECT OF MASK

CROSS-REFERENCE TO RELATED APPLICATION

This application is based on and claims priority under 35 U.S.C. § 119 to Korean Patent Application No. 10-2023-0000896, filed on Jan. 3, 2023 in the Korean Intellectual Property Office, the disclosure of which is incorporated by reference herein in its entirety.

BACKGROUND

Inventive concept relate to a method of removing a defect of a mask, and more particularly, to a method of removing a defect of a mask using atomic force microscopy (AFM).

With the development of electronics technology, down-scaling of semiconductor devices is rapidly progressing, thereby decreasing the sizes and spacings between components of semiconductor devices. Accordingly, masks used to manufacture semiconductor devices, e.g., photomasks, are becoming increasingly sophisticated with a smaller feature size.

Since masks are typically expensive, there is an economical need to remove defects in a mask rather than discard the mask if the mask is defective. Thus, methods of removing a defect of a mask using an electron beam (e-beam) or a focused ion beam (FIB) are used. However, the method using the e-beam or the FIB has a high possibility of causing another defect in the mask using high energy, so a method of removing a defect of a mask using an AFM has been introduced.

SUMMARY

Inventive concepts provide a method of removing a defect of a mask which enables efficient removal of a defect in a mask.

According to an embodiment of inventive concepts, a method of removing a defect of a mask may include generating a probe profile, the probe profile including characteristics of a probe of an atomic force microscope (AFM); generating a design-based reference image of a defect area by applying the probe profile to a design image of the defect area of the mask including a location of the defect; obtaining an AFM image of the defect area by scanning the defect area of the mask using the probe of the AFM; recognizing the defect as a recognized defect by comparing the AFM image of the defect area with the design-based reference image; and removing the recognized defect using the probe of the AFM.

According to an embodiment of inventive concepts, a method of removing a defect of a mask may include may include scanning an offset calibration region included in a mask using a probe of an atomic force microscope (AFM) to obtain an AFM image of the offset calibration region and calibrating an offset of the probe of the AFM by adjusting a zero point; generating a probe profile by comparing the AFM image of the offset calibration region with a design image of the offset calibration region, the probe profile including characteristics of the probe of the AFM; generating a design-based reference image of a defect area by applying the probe profile to a design image of the defect area of the mask including a location of the defect; obtaining an AFM image of the defect area by scanning the defect area of the mask using the probe of the AFM; recognizing the defect as a recognized defect by comparing the AFM image of the defect area with the design-based reference image; and removing the recognized defect using the probe of the AFM.

According to an embodiment of inventive concepts, a method of removing a defect of a mask may include preparing a mask including a substrate having a main exposure area and an offset calibration region, patterns on the substrate in the main exposure area, and a dummy pattern on the substrate in the offset calibration region; obtaining an atomic force microscope (AFM) image of the offset calibration region by scanning the offset calibration region of the mask using a probe of an AFM, and calibrating the offset of the probe of the AFM by adjusting a zero point; generating a probe profile by comparing the AFM image of the offset calibration region with a design image of the offset calibration region, the probe profile including characteristics of a probe of the AFM; generating a design-based reference image of a defect area by a convolution of a design image of the defect area of the mask including a location of the defect and the probe profile; obtaining an AFM image of the defect area by scanning the defect area of the mask using the probe of the AFM; recognizing the defect as a recognized defect by comparing the AFM image of the defect area with the design-based reference image; removing the recognized defect using the probe of the AFM; and performing a cleaning process on the mask.

BRIEF DESCRIPTION OF THE DRAWINGS

Embodiments will be more clearly understood from the following detailed description taken in conjunction with the accompanying drawings in which.

DETAILED DESCRIPTION

Figure 1:
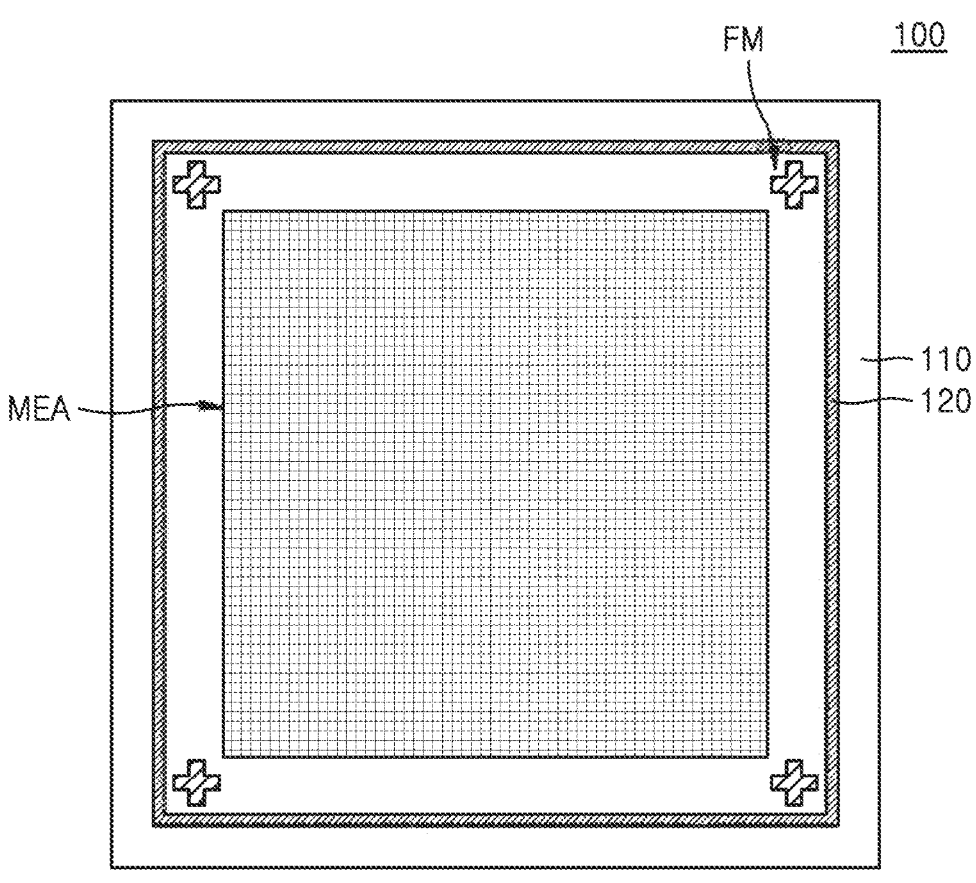
FIG. 1 is, as an example, a plan view of mask used in a method of removing a defect of a mask, according to an embodiment of inventive concepts.

FIG. 1 is, as an example, a plan view of a mask used in a method of removing a defect of a mask, according to an embodiment of inventive concepts.

Referring to FIG. 1, a mask 100 may include a substrate 110, a plurality of patterns formed in a main exposure area MEA, fiducial marks FM, and a dummy pattern 120. The substrate 110 may include low thermal expansion material (LTEM). In other words, the substrate 110 may include material with a low coefficient of thermal expansion (CTE). For example, the substrate 110 may include glass, silicon (Si), quartz, and the like. However, the material of the substrate 110 is not limited to the materials stated above.

The plurality of patterns may be positioned in the main exposure area MEA. The plurality of patterns positioned in the main exposure area MEA may be composed of (or include) a light-blocking film or composed of (or include) a reflective layer and an absorbing layer. The plurality of patterns may have a 1D or 2D shape, wherein the 1D shape may not refer to a line with no area, but a shape that extends in one direction, such as a line & space pattern, and the 2D shape may refer to a specific shape such as a circle or a polygon.

The light-blocking film may include material containing chromium. For example, the light-blocking film may include chromium or a chromium compound. In the chromium compound, elements, such as oxygen, nitrogen, carbon, hydrogen, boron, indium, tin, and molybdenum, may be included in chromium.

The reflective layer may have a multilayer structure in which tens of layers of two material layers are alternately stacked. For example, the reflective layer may include first material layers and second material layers that are alternately stacked. In an embodiment, about 40 to 60 layers of each of the first and second material layers may be stacked, but the number of stacked layers of each of the first and second material layers is not limited thereto. The first material layer may be a low refractive index layer, and the second material layer may be a high refractive index layer having a higher refractive index than the first material layer. For example, the first material layer may include molybdenum (Mo) and the second material layer may include Si, or the first material layer may include $Mo_2C$ or MoRu, and the second material layer may include beryllium (Be). However, the materials of the first and second material layers are not limited thereto. In an embodiment, the first material layer, which is a low refractive index layer, may be disposed on a lowermost portion of the reflective layer, and the second material layer, which is a high refractive index layer, may be disposed on an uppermost portion of the reflective layer.

In an embodiment, a capping layer may be disposed on the reflective layer. The capping layer may limit and/or prevent damage to the reflective layer and surface oxidation of the reflective layer. For example, the capping layer may cover a top surface of the high refractive index layer, e.g., the second material layer, to limit and/or prevent the high refractive index layer from being oxidized. For example, the capping layer may include a semiconductor or metal such as ruthenium (Ru), silicon (Si), chromium (Cr), tantalum (Ta), titanium (Ti), gallium arsenide (GaAs), and aluminum (Al), but the material of the capping layer is not limited thereto. In an embodiment, the capping layer may be omitted.

The absorbing layer may be disposed on the capping layer. When the capping layer is omitted, the absorbing layer may be disposed on the reflective layer, e.g., the second material layer. The absorbing layer may include material that absorbs light, e.g., extreme ultraviolet EUV (extreme ultraviolet) light, incident on the absorbing layer. Accordingly, the EUV light incident on the absorbing layer may not reach the capping layer and/or the reflective layer. The absorbing layer may include, for example, TaN, TaHf, TaHIN, TaBSi, TaBSiN, TaB, TaBN, TaSi, TaSiN, TaGe, TaGEN, TaZr, TaZrN, or a combination thereof, but the material of the absorbing layer is not limited thereto.

The dummy pattern 120 may be positioned outside the main exposure area MEA. The dummy pattern 120 may be, for example, a black boarder, but is not limited thereto. In an embodiment, the dummy pattern 120 may surround the main exposure area MEA. For example, the dummy pattern 120 may surround the main exposure area MEA in a frame shape. For example, the dummy pattern 120 may include the same material as the plurality of patterns positioned in the main exposure area MEA.

The fiducial marks FM may be used as a reference for defect coordinates when a defect on the mask 100 is inspected by a defect inspection device. The fiducial marks FM may not be directly used when patterns are generated on a substrate, e.g., a semiconductor wafer, using the mask 100. The fiducial marks FM may have, for example, a dot shape, a substantially cross shape, or a rectangular shape. The shape of the fiducial marks FM may be formed to facilitate detection by the defect inspection device. For example, the fiducial marks FM may have a dot shape, a circular dot shape, or a substantially cross shape. FIG. 1 shows an example in which the fiducial marks FM, which have a substantially cross shape, are formed on the mask 100, but the shape of the fiducial marks FM is not limited thereto. Since the mask 100 has the fiducial marks FM, the positional coordinates of a defect obtained through the defect inspection may be correlated with the positional coordinates of the fiducial marks FM, thereby accurately specifying the location of the defect of the mask 100. The fiducial mark FM may also be referred to as an alignment mark.

The fiducial marks FM may be formed near four corner portions of the mask 100. FIG. 1 shows that four fiducial marks FM are positioned in the vicinity of four corner portions, respectively, but this is an example and not limited thereto. For example, one or more fiducial marks FM may be positioned in the vicinity of at least three corner portions among four corner portions of the mask 100. For example, the size (width) of the fiducial marks FM may be, for example, about 200 nm to about 10 μm.

FIG. 1 shows that the fiducial marks FM are positioned between the dummy pattern 120 and the main exposure area MEA, so that the dummy pattern 120 is closer to the four corner portions of the mask 100 than the fiducial marks FM. However, this is an example and not limited thereto. For example, the dummy pattern 120 may be positioned between the fiducial marks FM and the main exposure area MEA so that the fiducial marks FM may be disposed closer to the four corner portions of the mask 100 than the dummy pattern 120.

The fiducial marks FM may be formed on the surface of the mask 100 by, for example, laser processing, but the method of forming the fiducial marks FM is not limited to laser processing. For example, the fiducial marks FM may be formed by a method such as photolithography, focused ion beam (FIB), sputtering, diamond needle scanning, indentation using a micro-indenter, imprinting, etc. The cross-section of the reference marks FM may have a concave shape but is not limited thereto, and the cross-section of the reference marks FM may have a protruding convex shape.

Figure 2:
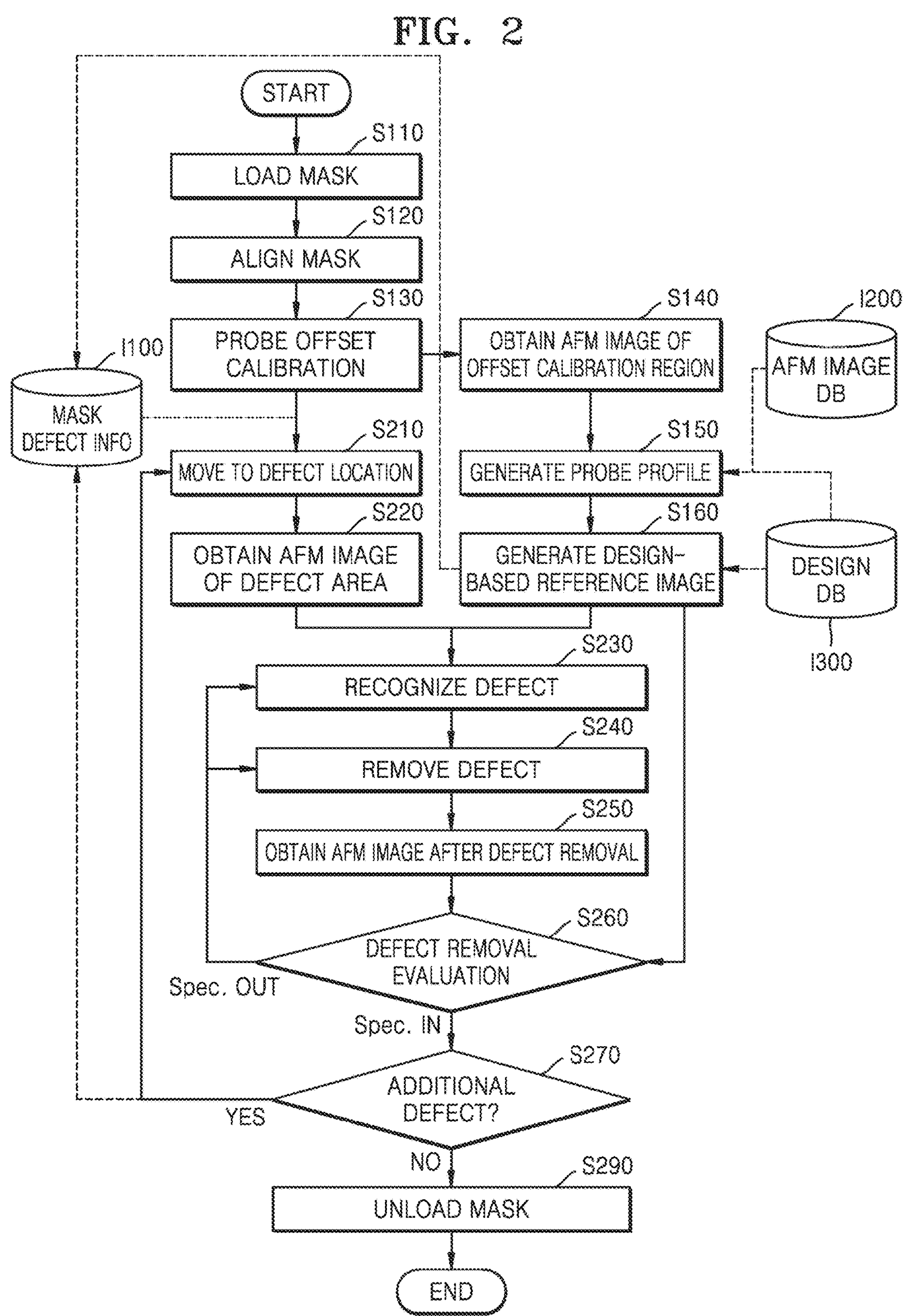
FIG. 2 is a flowchart schematically showing the process of a method of removing a defect of a mask, according to an embodiment of inventive concepts.

FIG. 2 is a flowchart schematically showing the process of a method of removing a defect of a mask, according to an embodiment of inventive concepts.

Referring to FIGS. 1 and 2, the mask 100 is loaded into a mask defect removal device (1000 in FIG. 10) (S110), and then the mask 100 is aligned (S120). In an embodiment, the mask 100 may be aligned using the fiducial marks FM shown in FIG. 1.

The mask defect removal device 1000 may include an atomic force microscope (AFM). The AFM may include a probe (PRB in FIG. 3). The offset of the probe PRB is calibrated in an offset calibration region (OSR in FIG. 3) included in the loaded mask 100 (S130).

A part of the dummy pattern 120 may be included in the offset calibration region OSR. For example, the offset calibration region OSR may include a portion of an edge extending in a first horizontal direction and a portion of an edge extending in a second horizontal direction orthogonal to the first horizontal direction of the dummy pattern 120.

The offset calibration of the probe PRB may be a task of performing zero point adjustment to ensure that the probe PRB properly scans the center of the current location in the offset calibration region OSR of the mask 100. For example, the offset calibration of the probe PRB may be a task of performing zero point adjustment by comparing the AFM image obtained by scanning the offset calibration region OSR using the probe PRB of the AFM to the general microscope image of the offset calibration region OSR.

Since the offset calibration region OSR is scanned using the probe PRB of the AFM in the process of calibrating the offset of the probe PRB in the offset calibration region OSR (S130), an AFM image (ORI in FIG. 3) of the offset calibration region OSR may be obtained (S140) in the process of calibrating the offset of the probe PRB in the offset calibration region OSR (S130).

A probe profile (PBP in FIG. 4) is generated from the AFM image ORI of the offset calibration region OSR (S150). The probe profile PBP may include information on the probe characteristics, such as the aspect ratio (A/R), which is a ratio of a length to a width of the probe PRB, the probe wear which indicates whether the probe PRB is damaged, and the asymmetry of the probe PRB.

When the A/R of the probe PRB is large, a dark region may be reduced and a clear region may be enlarged in the AFM image. When the A/R of the probe PRB is small, the clear region may be reduced and the dark region may be enlarged in the AFM image. The clear region and the dark region do not refer to a relatively bright region and a relatively dark region, respectively, in the AFM image. The clear region is a portion of the AFM image obtained by scanning a lower portion of the mask 100 where no pattern exists, and the dark region is a portion of the AFM image obtained by scanning an upper portion of the mask 100 where patterns exist. For example, in the case of a line and space pattern, when the A/R of the probe PRB is large, a line portion may be reduced and a space portion may be enlarged in the AFM image, and when the A/R of the probe PRB is small, the line portion may be enlarged and the space portion may be reduced in the AFM image. That is, when the A/R of the probe PRB is large, a portion where no pattern exists may be enlarged and a portion where patterns exist may be reduced in the AFM image, and when the A/R of the probe PRB is small, a portion where no pattern exists may be reduced and a portion where patterns exist may be enlarged in the AFM image.

When the probe wear is high due to damage to the probe PRB, blurring may occur at the edge of the patterns in the AFM image and resolution may deteriorate. In addition, according to the damage location of the probe PRB, the blurring occurring at the edge extending in the first horizontal direction may be different from the blurring occurring at the edge extending in the second horizontal direction. Therefore, the probe wear, which indicates whether the probe PRB is damaged, may include the degree of damage to the probe PB and the damage location of the probe PRB.

When the probe PRB has asymmetry, an edge having a side of the patterns toward which one side of the probe PRB faces may appear different from an edge having a side of the patterns toward which the other side of the probe PRB faces in the AFM image. For example, when one side of the probe PRB is relatively close to the vertical and the other side has asymmetry relatively far from the vertical, an edge having a side of the patterns toward which one side of the probe PRB faces may appear more clearly than an edge having a side of the patterns toward which the other side faces in the AFM image.

The probe profile PBP may have at least three-dimensional information on the probe PRB to include information on probe characteristics such as A/R, which is a ratio of the length to width of the probe PRB, the probe wear, which indicates whether or not the probe PRB is damaged, and the asymmetry of the probe PRB. For example, the probe profile PBP may have information corresponding to a three-dimensional image of the probe PRB.

In an embodiment, the probe profile PBP may be generated with reference to an AFM image DB 1200 having previously stored AFM images. For example, the AFM image DB 1200 may have characteristics of the AFM images, e.g., information on area enlargement/reduction, resolution degradation, sharpness differences, etc., according to the A/R of the probe PRB, the degree of wear of the probe PRB, and the asymmetry of the probe PRB extracted from the AFM images previously stored in the AFM image DB 1200.

The probe profile PBP may be generated by comparing the AFM image ORI of the offset calibration region OSR with a design image (ORD in FIG. 4) of the offset calibration region OSR. The design image ORD of the offset calibration region OSR may be provided from a design DB 1300. In an embodiment, a semiconductor design layout may be stored in the design DB 1300. For example, the semiconductor design layout stored in the design DB 1300 may be generated in a graphic database II (GDSII) stream format. The semiconductor design layout may be, for example, a mask layout. The design image ORD may be generated by extracting a portion corresponding to the offset calibration region OSR from the semiconductor design layout.

After calibrating the offset of the probe PRB (S130), the probe PRB may be moved to the location of the defect (S210). The process of moving the probe PRB to the location of the defect (S210) may be performed after generating the probe profile PBP (S150) but is not limited thereto. For example, the process of generating the probe profile PBP (S150) may be performed simultaneously with the process of moving the probe PBP to the location of the defect (S210).

The probe PRB may be moved to the location of the defect with reference to the location of the defect of the mask 100 included in mask defect information 1100 (S210).

In an embodiment, the mask defect information 1100 may have the location of the defect of the mask 100 extracted from the location of the defect of a semiconductor substrate, e.g., the location of the defect of a semiconductor wafer obtained through defect inspection of the semiconductor wafer on which the patterns are formed using the mask 100, but is not limited thereto. For example, the mask defect information 1100 may have the location of the defect of the mask 100 extracted from a defect of the semiconductor substrate, e.g., a defect of a semiconductor wafer obtained through an electrical test on the semiconductor wafer on which the patterns are formed using the mask 100. The semiconductor wafer may include a plurality of dies, and each of the plurality of dies may be formed using the same mask 100. Therefore, in the defect inspection of the semiconductor wafer including the plurality of dies, when a defect is detected in each of the plurality of dies at the same location or when the same defect is detected in each of the plurality of dies in an electrical test for the semiconductor wafer including the plurality of dies, a defect in the mask 100 may be suspected. Through the defect inspection of the semiconductor wafer or the electrical test for the semiconductor wafer, when a defect in the mask 100 is suspected, the location in the mask 100 suspected of having a defect may be extracted from the defect inspection result for the semiconductor wafer or the electrical test result for the semiconductor wafer, and may be stored in the mask defect information 1100.

After moving the probe PRB to the location in the mask 100 suspected of having a defect stored in the mask defect information 1100, e.g., the location of the defect of the mask 100 (S210), an AFM image (DRI in FIG. 6) of a defect area is obtained by scanning the defect area of the mask 100 including the location of the defect of the mask 100 using the probe PRB of the AFM (S220). The defect area of the mask 100 may be a scan area scanned including the location of the defect of the mask 100 in the AFM, and may vary depending on the magnification selected in the AFM. The defect area of the mask 100 may be located in the main exposure area (MEA in FIG. 1) of the mask 100.

By comparing the obtained AFM image DRI of the defect area with a design-based reference image (DRI-D in FIG. 6) of the defect area, the defect at the location of the defect of the mask 100 (DEF-RE in FIG. 6) may be recognized (S230). The defect DEF-RE recognized at the location of the defect of the mask 100 may be referred to as a recognized defect.

After receiving a design image (DRD in FIG. 5) of the defect area from the design DB 1300, the design-based reference image DRI-D may be generated by applying the design image DRD of the defect area to the probe profile PBP. For example, the design-based reference image DRI-D may be generated by convolution of the design image DRD of the defect area and the probe profile PBP. Since the probe profile PBP includes information on probe characteristics such as the A/R of the probe PRB, the degree of wear of the probe PRB, and the asymmetry of the probe PRB, the design-based reference image DRI-D may be substantially the same as an AFM image of a flawless defect area, e.g., a defect area with no defects, which is scanned using the probe PRB of the AFM.

Accordingly, when the difference between the design-based reference image DRI-D and the AFM image DRI of the defect area is extracted by comparing the design-based reference image DRI-D that is substantially the same as the AFM image of the flawless defect area with the AFM image DRI of the defect area, the defect DEF-RE may be recognized (S230).

Through comparison of the dark region and the clear region in the recognized defect DEF-RE and the AFM image DRI of the defect area, the three-dimensional location of the recognized defect, e.g., the height of the defect DEF-RE recognized from the top surface of the substrate 110 of the mask 100 or from the top surface of the patterns included in the mask 100 may be obtained. For example, after setting the brightness of the clear region to 0 and the brightness of the dark area to 100, when the brightness of the recognized defect DEF-RE is greater than 100, it may be determined that the recognized defect is higher than the top surface of the patterns included in the mask 100, and when the brightness of the recognized defect DEF-RE is between 0 and 100, it may be determined that the recognized defect DEF-RE is between the top surface of the patterns included in the mask 100 and the top surface of the substrate 110.

By scanning the probe PRB with respect to a defect removal area (DFR of FIG. 6) after recognizing the defect DEF-RE, the recognized defect DEF-RE may be removed (S240). Scanning of the probe PRB to remove the recognized defect DEF-RE may be performed using the three-dimensional location of the recognized defect DEF-RE, e.g., the height of the defect DEF-RE recognized from the top surface of the substrate 110 of the mask 100 or from the top surface of the patterns included in the mask 100. For example, by scanning the probe PRB in the defect removal area DFR to position the tip of the probe PRB at a vertical level between the heights of the top surface of the substrate 110 and the recognized defect DEF-RE or at a vertical level between the heights of the top surface of the patterns included in the mask 100 and the recognized defect DEF-RE and causing the probe PRB to apply physical force to the recognized defect DEF-RE, the recognized defect DEF-RE may be removed (S240).

By re-scanning the defect area of the mask 100 after the recognized defect DEF-RE is removed, an AFM image (DRI-RP in FIG. 8 and/or DRI-CLN) after defect removal of the defect area of the mask 100 is obtained (S250). By scanning the defect area of the mask 100 using the probe PRB of the AFM immediately after removing the defect of the defect area of the mask 100, the AFM image DRI-RP (hereinafter, referred to as the AFM image after first defect removal) after defect removal of the defect area of the mask 100 may be obtained. By scanning the defect area of the mask 100 using the probe PRB of the AFM after removing the defect of the defect area of the mask 100 and performing a cleaning process on the mask 100, the AFM image DRI-CLN (hereinafter, referred to as the AFM image after second defect removal) after defect removal of the defect area of the mask 100 may be obtained. Both of the AFM image after first defect removal DRI-RP and the AFM image after second defect removal DRI-CLN may also be obtained.

Through the AFM image after first defect removal DRI-RP or the AFM image after second defect removal DRI-CLN, when a residual defect (DEF-RP in FIG. 8) exists but does not affect the formation of patterns on the semiconductor substrate using the mask 100 as the defect DEF-RE is completely removed or partially removed, it may be evaluated as Spec. IN, and when the residual defect DEF-RP affects the formation of patterns on the semiconductor substrate using the Mask 100 as the defect DEF-RE is not removed or partially removed, it may be evaluated as Spec. OUT (S260).

When it is evaluated as Spec. IN, the presence or absence of additional defects may be checked with reference to the mask defect information 1100 (S270). When there is no additional defect (NO), the mask 100 may be unloaded from the mask defect removal device 1000 (S290), and the defect removal of the mask 100 may be finished. When there is an additional defect (YES), the probe PRB may be moved to the location of the additional defect of the mask S100 with reference to the location of the additional defect of the mask 100 included in the mask defect information 1100, and the processes from S210 to S260 for removing the defect may be repeatedly performed.

When it is evaluated as Spec. OUT, the processes from S240 to S260 for removing the defect at the location of the defect of the mask 100 may be performed again. Alternatively, when it is evaluated as Spec. OUT, the processes from S230 to S260 for removing the defect after re-recognizing the defect DEF-RE at the defect area of the mask 100 may be performed by comparing the AFM image after first defect removal DRI-RP or the AFM image after second defect removal DRI-CLN with the design-based reference image DRI-D of the defect area.

In the method of removing a defect of a mask according to an embodiment of inventive concepts, the AFM image ORI of the offset calibration region OSR may be obtained in the process of calibrating the offset of the probe PRB in the offset calibration region OSR (S130), and after the probe profile PBP is generated from the AFM image ORI of the offset calibration region OSR, the defect DEF-RE may be recognized in the defect area of the mask 100 by comparing the design-based reference image DRI-D generated by convolution of the design image DRD of the defect area and the probe profile PBP with the obtained AFM image DRI of the defect area.

In the conventional defect inspection method, after scanning of at least two areas including a defect area and at least one comparison area corresponding to the defect area is performed, a defect may be recognized by comparing the defect area with the comparison area. In particular, when scanning two areas, it is difficult to determine the defect area where the actual defect exists among the two areas, and thus, three or more areas are scanned to determine one area with a difference as a defect area.

However, in the method of removing a defect of a mask according to an embodiment of inventive concepts, until the defect is removed (S240), scanning of the defect area of the mask 100 using the probe PRB of the AFM may be performed only once. Therefore, scanning using the probe PRB of the AFM, which takes a relatively long time, may be limited and/or minimized, and the time for removing a defect of a mask may be shortened.

In addition, since the area where the final scanning is performed may be different from the defect area where the actual defect exists when removing the defect after scanning at least two areas, the precision of the location of the defect DEF-RE may decrease in the process of moving the probe PRB of the AFM back to the defect area.

However, in the method of removing a defect of a mask according to an embodiment of inventive concepts, since the defect is recognized (S230) and removed (S240) immediately after scanning of the defect area of the mask 100 using the probe PRB of the AFM is performed, without moving the probe PRB of the AFM to another area, the precision of the location of the defect DEF-RE may increase and the defect DEF-RE may be precisely removed. The phrase "without moving the probe PRB of the AFM to another area" may not refer to without moving the probe PRB of the AFM at all, but slightly moving the probe PRB of the AFM to a location adjacent to the defect area of the mask 100, e.g., moving the probe PRB of the AFM to the defect area of the mask 100 or to the nearby probe standby location or raising the probe PRB of the AFM vertically.

Figure 3:
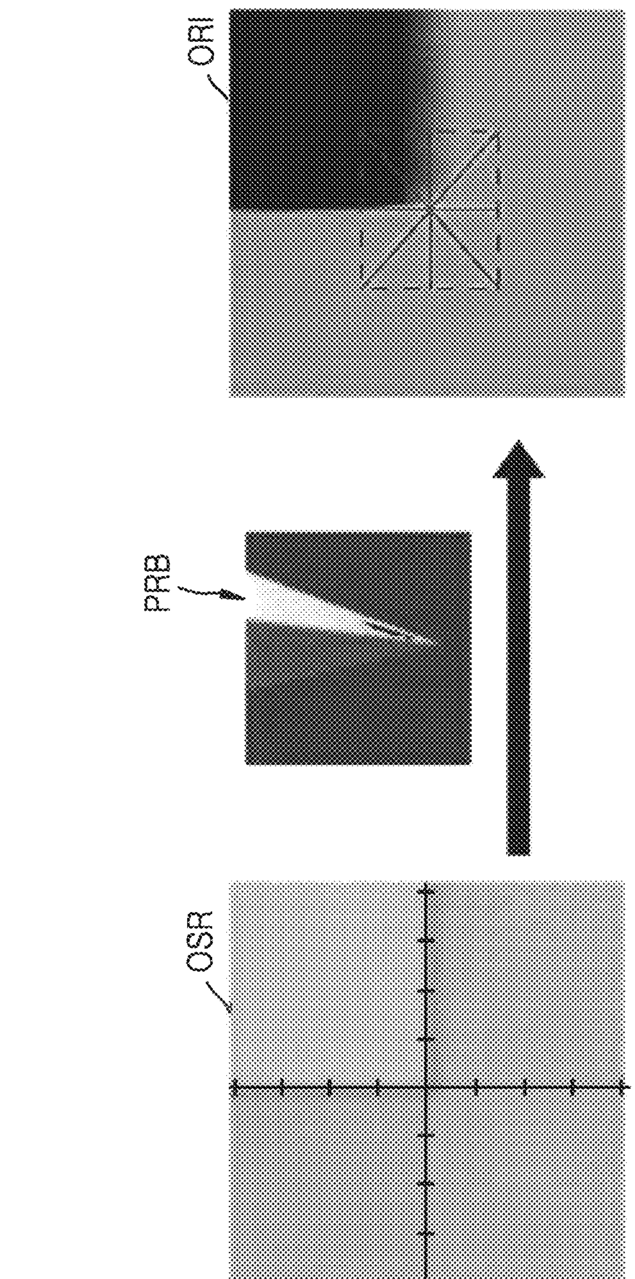
FIG. 3 is a conceptual diagram illustrating a process of performing probe offset calibration in a method of removing a defect of a mask according to an embodiment of inventive concepts.

FIG. 3 is a conceptual diagram illustrating a process of performing probe offset calibration in a method of removing a defect of a mask according to an embodiment of inventive concepts.

Referring to FIGS. 1 to 3, the offset of the probe PRB is calibrated in the offset calibration region OSR included in the loaded mask 100 (S130). A part of the dummy pattern 120 may be included in the offset calibration region OSR. For example, the offset calibration region OSR may include a portion of an edge extending in a first horizontal direction and a portion of an edge extending in a second horizontal direction orthogonal to the first horizontal direction of the dummy pattern 120. In an embodiment, the offset calibration region OSR may include a corner portion of the dummy pattern 120, at which a portion of an edge thereof extending in the first horizontal direction intersects with a portion of an edge thereof extending in the second horizontal direction.

The offset calibration of the probe PRB may be a task of performing zero point adjustment to ensure that the probe PRB properly scans the center of the current location in the offset calibration region OSR of the mask 100. For example, the offset calibration of the probe PRB may be a task of performing zero point adjustment by comparing the AFM image ORI obtained by scanning the offset calibration region OSR using the probe PRB of the AFM to a normal microscope image (left image) of the offset calibration region OSR.

Since the offset calibration region OSR is scanned using the probe PRB of the AFM in the process of calibrating the offset of the probe PRB in the offset calibration region OSR (S130), the AFM image ORI of the offset calibration region OSR may be obtained (S140) in the process of calibrating the offset of the probe PRB in the offset calibration region OSR (S130).

Figure 4:
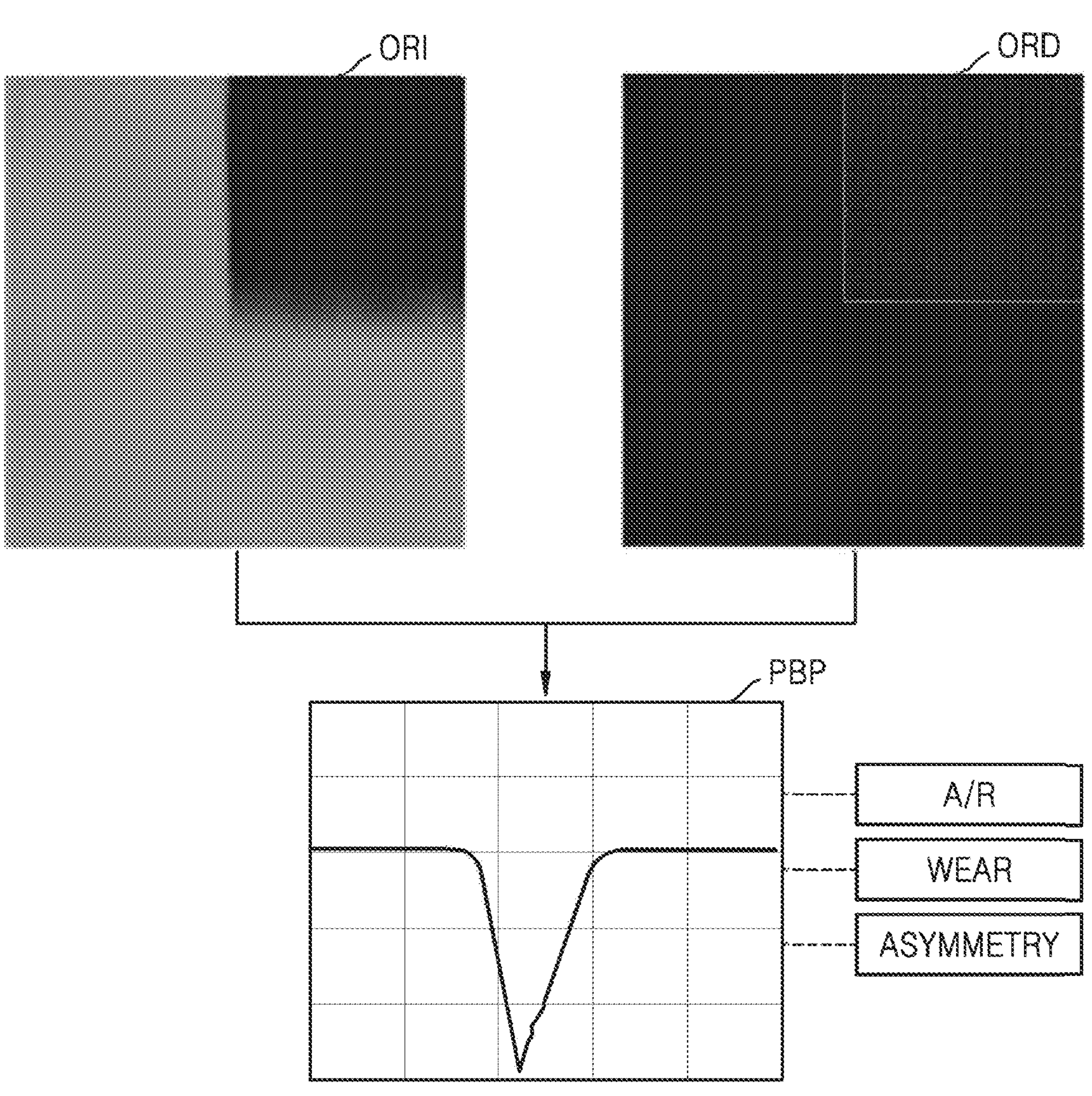
FIG. 4 is a conceptual diagram illustrating a process of generating a probe profile in a method of removing a defect of a mask according to an embodiment of inventive concepts.

FIG. 4 is a conceptual diagram illustrating a process of generating a probe profile in a method of removing a defect of a mask according to an embodiment of inventive concepts.

Referring to FIGS. 1 to 4, the probe profile PBP is generated from the AFM image ORI of the offset calibration region OSR (S150). The probe profile PBP may include information on the probe characteristics, such as the A/R, which is a ratio of a length to a width of the probe PRB, the probe wear which indicates whether the probe PRB is damaged, and the asymmetry of the probe PRB.

When the A/R of the probe PRB is large, a portion where no pattern exists may be enlarged and a portion where patterns exist may be reduced in the AFM image, and when the A/R of the probe PRB is small, a portion where no pattern exists may be reduced and a portion where patterns exist may be enlarged in the AFM image.

When the probe wear is high due to damage to the probe PRB, blurring may occur at the edge of the patterns in the AFM image and resolution may deteriorate. For example, blurring occurring at the edge of the dummy pattern 120 extending in the second horizontal direction (vertical direction in FIG. 4) is larger than blurring occurring at the edge of the dummy pattern 120 extending in the first horizontal direction (horizontal direction in FIG. 4), damage to a portion of the probe PRB of the AFM may exist, which has a significant effect on scanning the edge of the dummy pattern 120 extending in the first horizontal direction.

Accordingly, the degree of wear of the probe PRB may be obtained by comparing the degree of blurring occurring at the edge of the dummy pattern 120 extending in the first horizontal direction in the AFM image ORI of the offset calibration region OSR with the degree of blurring occurring at the edge of the dummy pattern 120 extending in the second horizontal direction, and the degree of wear of the probe PRB may include a damage level and a damage location of the probe PRB.

In addition, when one side of the probe PRB is relatively close to the vertical and the other side has asymmetry relatively far from the vertical, an edge having a side of the patterns toward which one side of the probe PRB faces may appear more clearly than an edge having a side of the patterns toward which the other side thereof faces in the AFM image.

The probe profile PBP may have at least three-dimensional information on the probe PRB to include information on probe characteristics such as the A/R, which is a ratio of the length to the width of the probe PRB, the probe wear which indicates whether the probe PRB is damaged, and the asymmetry of the probe PRB. For example, the probe profile PBP may have information corresponding to a three-dimensional image of the probe PRB.

In an embodiment, the probe profile PBP may be generated with reference to the AFM image DB 1200 having previously stored AFM images. For example, the AFM image DB 1200 may have characteristics of the AFM image, e.g., information on area enlargement/reduction, resolution degradation, sharpness differences, etc., according to probe characteristics such as the A/R of the probe PRB, the degree of wear of the probe PRB, and the asymmetry of the probe PRB extracted from AFM images previously stored in the AFM image DB 1200.

The probe profile PBP may be generated by comparing the AFM image ORI of the offset calibration region OSR with the design image ORD of the offset calibration region OSR. The design image ORD of the offset calibration region OSR may be provided from the design DB 1300. The design image ORD may be generated by extracting a portion corresponding to the offset calibration region OSR from the semiconductor design layout.

Figure 5:
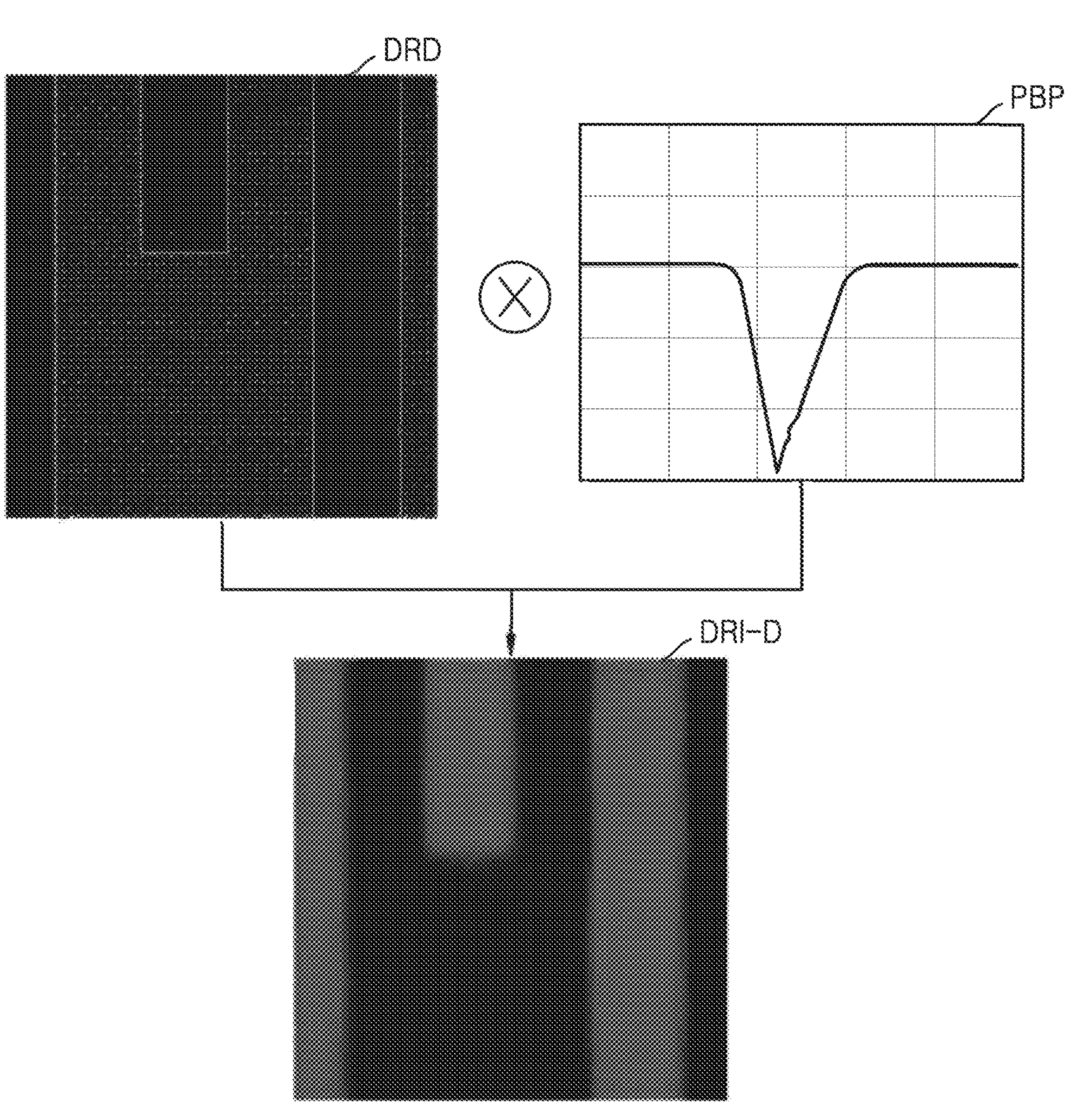
FIG. 5 is a conceptual diagram illustrating a process of generating a design-based reference image in a method of removing a defect of a mask according to an embodiment of inventive concepts.

FIG. 5 is a conceptual diagram illustrating a process of generating a design-based reference image in a method of removing a defect of a mask according to an embodiment of inventive concepts.

Referring to FIGS. 1 to 5, after receiving the design image DRD of the defect area of the mask 100 from the design DB 1300, the design-based reference image DRI-D may be generated by applying the probe profile PBP to the design image DRD of the defect area (S160). For example, the design-based reference image DRI-D may be generated by convolution of the probe profile PBP and the design image DRD of the defect area (S160). Since the probe profile PBP includes information on probe characteristics such as the A/R of the probe PRB, the degree of wear of the probe PRB, and the asymmetry of the probe PRB, the design-based reference image DRI-D may be substantially the same as the AFM image of the flawless defect area, e.g., defect area with no defect DEF-RE, which is scanned using the probe PRB of the AFM.

Figure 6:
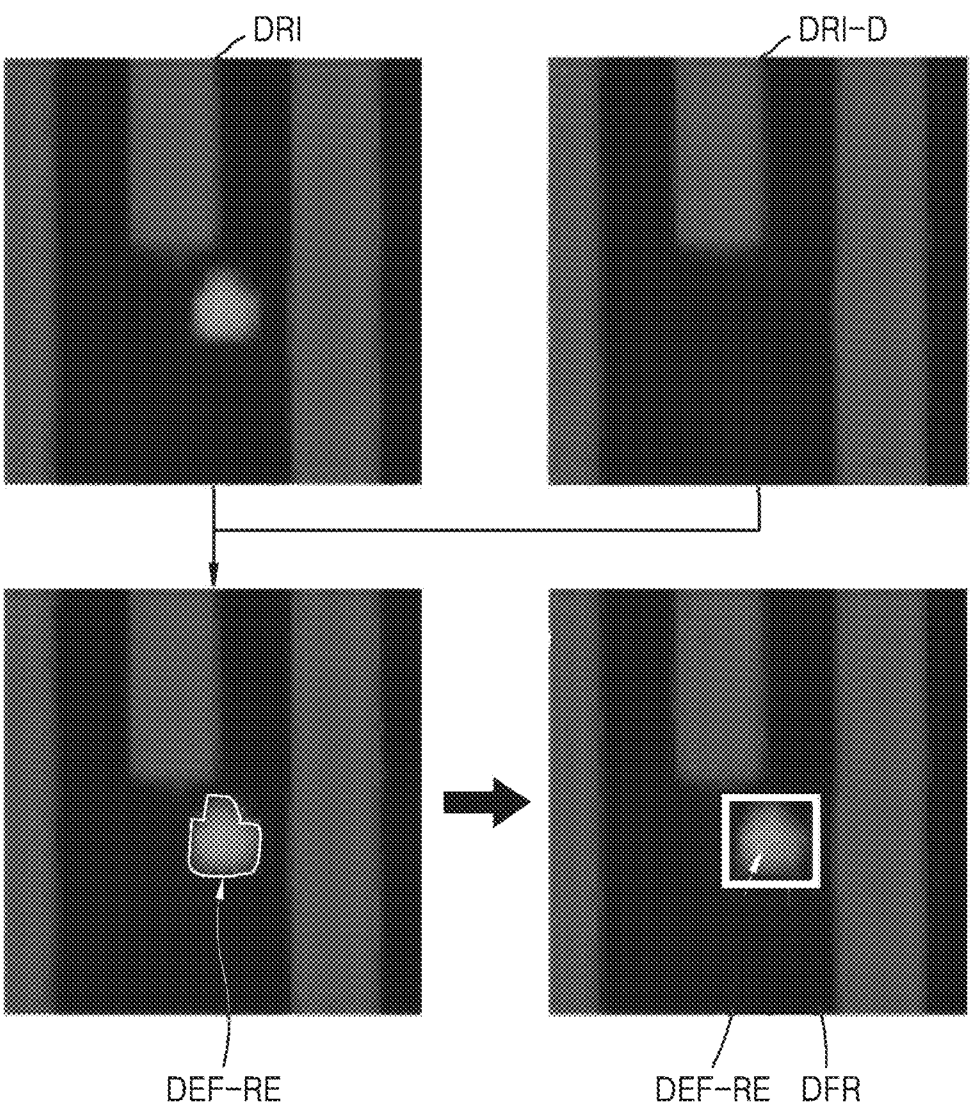
FIG. 6 shows images illustrating a process of recognizing a defect in a method of removing a defect of a mask according to an embodiment of inventive concepts.

FIG. 6 shows images illustrating a process of recognizing a defect in a method of removing a defect of a mask according to an embodiment of inventive concepts.

Referring to FIGS. 1 to 6, after calibrating the offset of the probe PRB (S130), the probe PRB is moved to the location of the defect with reference to the location of the defect of the mask 100 included in the mask defect information 1100. In an embodiment, the mask defect information 1100 may include the location of the defect of the mask 100 extracted from the location of the defect of the semiconductor substrate, e.g., the location of the defect of the semiconductor wafer obtained through defect inspection of the semiconductor wafer on which the patterns are formed using the mask 100, and/or the location of the defect of the mask 100 extracted from the defect of the semiconductor wafer obtained through the electrical test on the semiconductor wafer on which the patterns are formed using the mask 100.

After moving the probe PRB to the location of the mask 100 suspected of having a defect stored in the mask defect information 1100, e.g., location of the defect of the mask 100 (S210), the defect area of the mask 100, where the location of the defect of the mask 100 is included, is scanned using the probe PRB of the AFM to obtain the AFM image DRI of the defect area (S220).

The defect DEF-RE may be recognized at the location of the defect of the mask 100 by comparing the obtained AFM image DRI of the defect area with the design-based reference image DRI-D of the defect area (S230).

In the conventional defect inspection method, after scanning of at least two areas including a defect area and at least one comparison area corresponding to the defect area is performed, a defect may be recognized by comparing the defect area with the comparison area. In particular, when scanning two areas, it is difficult to determine the defect area where the actual defect exists among the two areas, and thus, after scanning three or more areas, one area with a difference is determined as a defect area.

However, in the method of removing a defect of a mask according to an embodiment of inventive concepts, the AFM image ORI of the offset calibration region OSR may be obtained in the process of calibrating the offset of the probe PRB in the offset calibration region OSR (S130), and after generating the probe profile PBP from the AFM image ORI of the offset calibration region OSR, by comparing the design-based reference image DRI-D generated by convolution of the design image DRD of the defect area and the probe profile PBP to the AFM image DRI of the obtained one defect area, the defect DEF-RE may be recognized in the defect area of the mask 100 (S230). Therefore, until the defect DEF-RE is recognized (S230), the defect area of the mask 100 may be scanned using the probe PRB of the AFM only once. Therefore, scanning using the probe PRB of the AFM, which takes a relatively long time, may be minimized, and the time for removing a defect of a mask may be shortened. In addition, even when the defect area of the mask 100 includes unique patterns that are not found in other areas of the mask 100, the defect DEF-RE may be recognized at the location of the defect of the mask 100 (S230).

After receiving the design image DRD of the defect area from the design DB 1300, the design-based reference image DRI-D may be generated by applying the design image DRD of the defect area to the probe profile PBP. For example, the design-based reference image DRI-D may be generated by convolution of the probe profile PBP and the design image DRD of the defect area. Since the probe profile PBP includes information on probe characteristics such as the A/R of the probe PRB, the degree of wear of the probe PRB, and the asymmetry of the probe PRB, the design-based reference image DRI-D may be substantially the same as the AFM image of the flawless defect area, e.g., defect area with no defect DEF-RE, which is scanned using the probe PRB of the AFM.

Accordingly, when the difference between the design-based reference image DRI-D and the AFM image DRI of the defect area is extracted by comparing the design-based reference image DRI-D that is substantially the same as the AFM image of the flawless defect area with the AFM image DRI of the defect area, the defect DEF-RE may be recognized (S230).

Through comparison of the dark region and the clear region in the recognized defect DEF-RE and the AFM image DRI of the defect area, the three-dimensional location of the recognized defect, e.g., the height of the defect DEF-RE recognized from the top surface of the substrate 110 of the mask 100 or from the top surface of the patterns included in the mask 100 may be obtained. For example, after setting the brightness of the clear region to 0 and the brightness of the dark region to 100, when the brightness of the recognized defect DEF-RE is greater than 100, it may be determined that the recognized defect is higher than the top surface of the patterns included in the mask 100, and when the brightness of the recognized defect DEF-RE is between 0 and 100, it may be determined that the recognized defect DEF-RE is between the top surface of the patterns included in the mask 100 and the top surface of the substrate 110.

Figure 7:
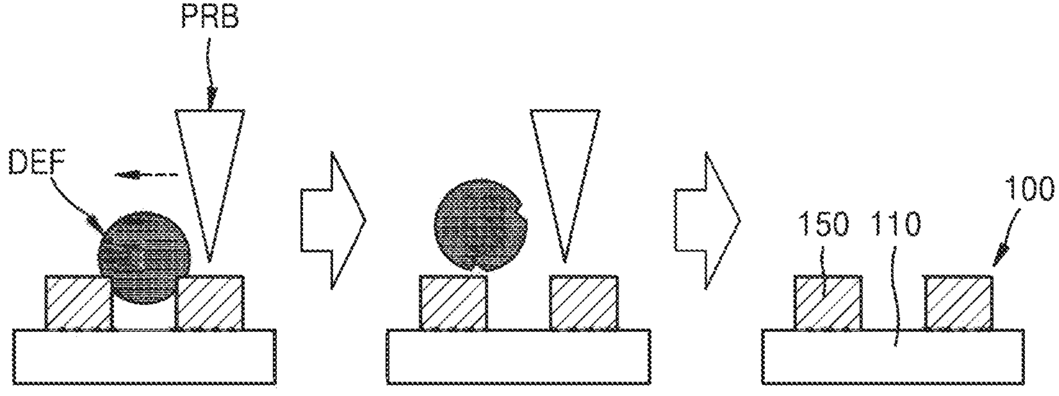
FIG. 7 is a conceptual diagram illustrating a process of removing a defect in a method of removing a defect of a mask according to an embodiment of inventive concepts.

FIG. 7 is a conceptual diagram illustrating a process of removing a defect in a method of removing a defect of a mask according to an embodiment of inventive concepts.

Referring to FIGS. 1 to 7, by setting the defect removal area DFR after recognizing the defect DEF-RE and scanning the probe PRB with respect to the defect removal area DFR, the recognized defect DEF-RE may be removed (S240). Scanning of the probe PRB to remove the recognized defect DEF-RE may be performed using the three-dimensional location of the recognized defect DEF-RE, e.g., the height of the recognized defect DEF-RE from the top surface of the substrate 110 of the mask 100 or the top surface of the patterns included in the mask 100. For example, the recognized defect DEF-RE may be removed by scanning the probe PRB at the defect removal area DFR to position the tip of the probe PRB at a vertical level between the heights of the top surface of the substrate 110 and the recognized defect DEF-RE or a vertical level between the heights of the top surface of the patterns 150 included in the mask 100 and the recognized defect DEF-RE and causing the probe PRB to apply physical force to the recognized defect DEF-RE, and when necessary, the defect DEF-RE may be removed from the mask 100 by performing a cleaning process on the mask 100 (S240).

Figure 8:
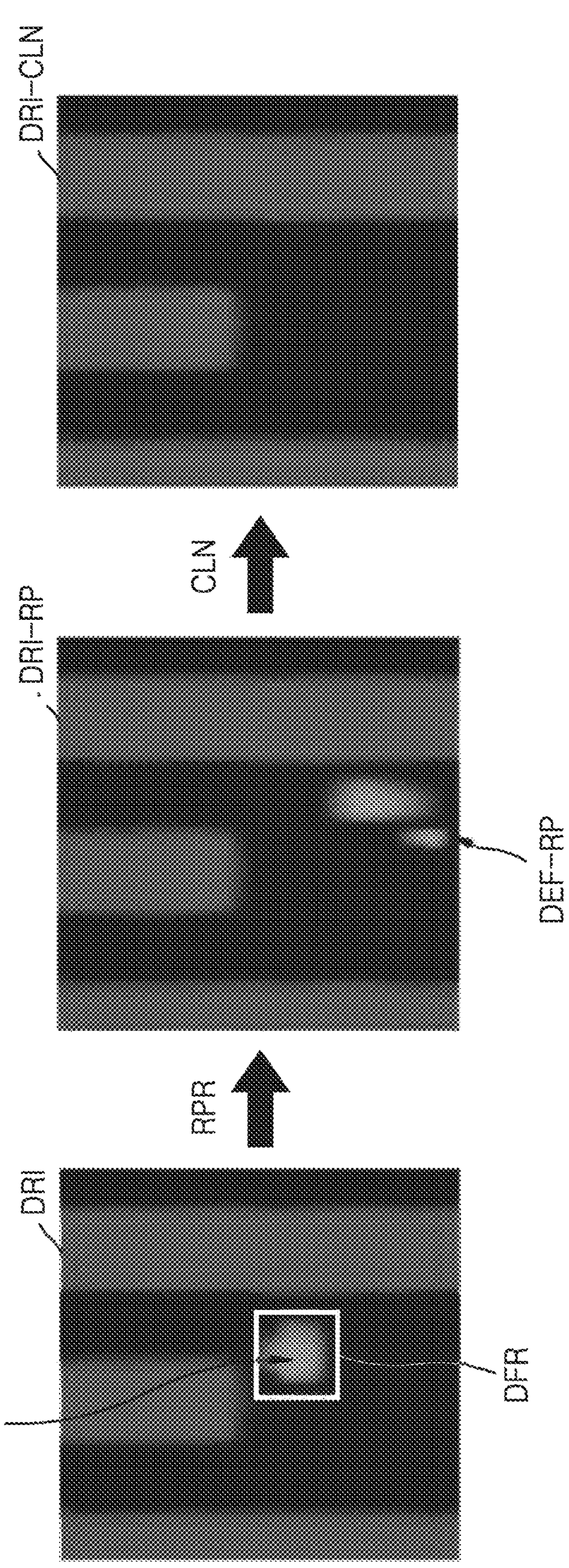
FIG. 8 shows images illustrating a process of removing a defect in a method of removing a defect of a mask according to an embodiment of inventive concepts.

FIG. 8 shows images illustrating a process of removing a defect in a method of removing a defect of a mask according to an embodiment of inventive concepts.

Referring to FIGS. 1 to 8, by scanning the probe PRB with respect to the defect removal area DFR after recognizing the defect DEF-RE, the recognized defect DEF-RE may be removed (S240). Scanning of the probe PRB to remove the recognized defect DEF-RE may be performed using the three-dimensional location of the recognized defect DEF-RE, e.g., the height of the defect DEF-RE recognized from the top surface of the substrate 110 of the mask 100 or from the top surface of the patterns included in the mask 100. For example, by scanning the probe PRB in the defect removal area DFR to position the tip of the probe PRB at a vertical level between the heights of the top surface of the substrate 110 and the recognized defect DEF-RE or at a vertical level between the heights of the top surface of the patterns included in the mask 100 and the recognized defect DEF-RE and causing the probe PRB to apply physical force to the recognized defect DEF-RE, the recognized defect DEF-RE may be removed (S240).

After removing the defect DEF-RE, the AFM image after first defect removal DRI-RP of the defect area of the mask 100 may be obtained by immediately re-scanning the defect area of the mask 100. When necessary, the AFM image after second defect removal DRI-CLN of the defect area of the mask 100 may be obtained by scanning the defect area of the mask 100 using the probe PRB of the AFM after performing a cleaning process CLN on the mask 100 after removing the defect of the defect area of the mask 100.

Through the AFM image after first defect removal DRI-RP or the AFM image after second defect removal DRI-CLN, when a residual defect DEF-RP exists but does not affect the formation of patterns on the semiconductor substrate using the mask 100 as the defect DEF-RE is completely removed or partially removed, it may be evaluated as Spec. IN, and when the residual defect DEF-RP affects the formation of patterns on the semiconductor substrate using the mask 100 as the defect DEF-RE is not removed or partially removed, it may be evaluated as Spec. OUT (S260).

Figure 9A:
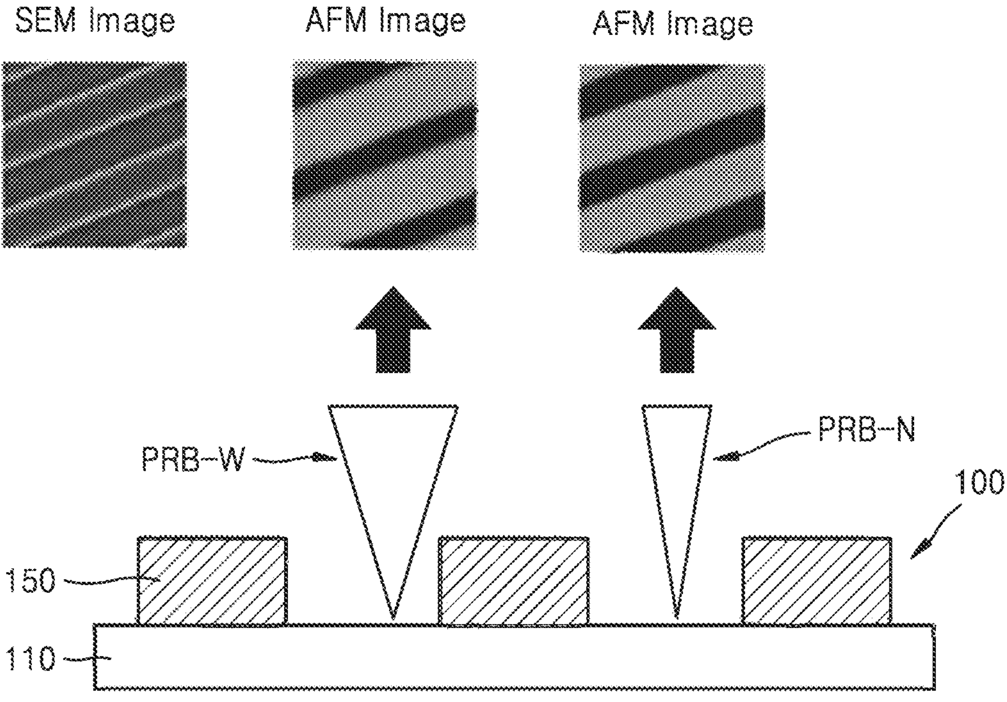
FIGS. 9A to 9C are conceptual diagrams illustrating probe characteristics of an atomic force microscope (AFM) used in a method of removing a defect of a mask according to an embodiment of inventive concepts.
Figure 9B:
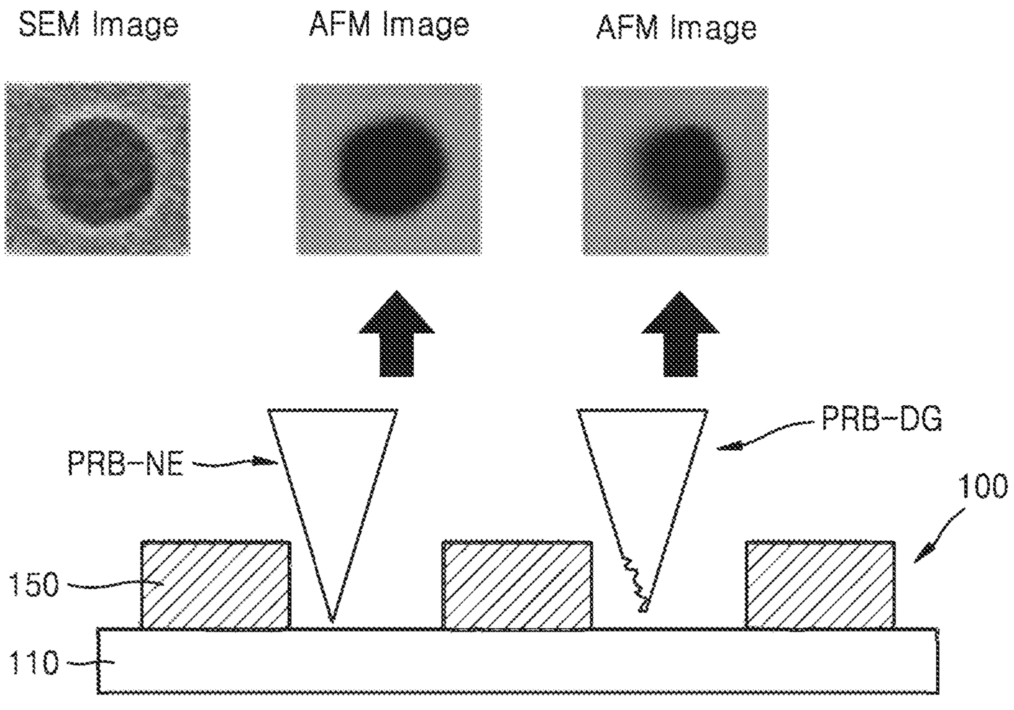
Figure 9C:
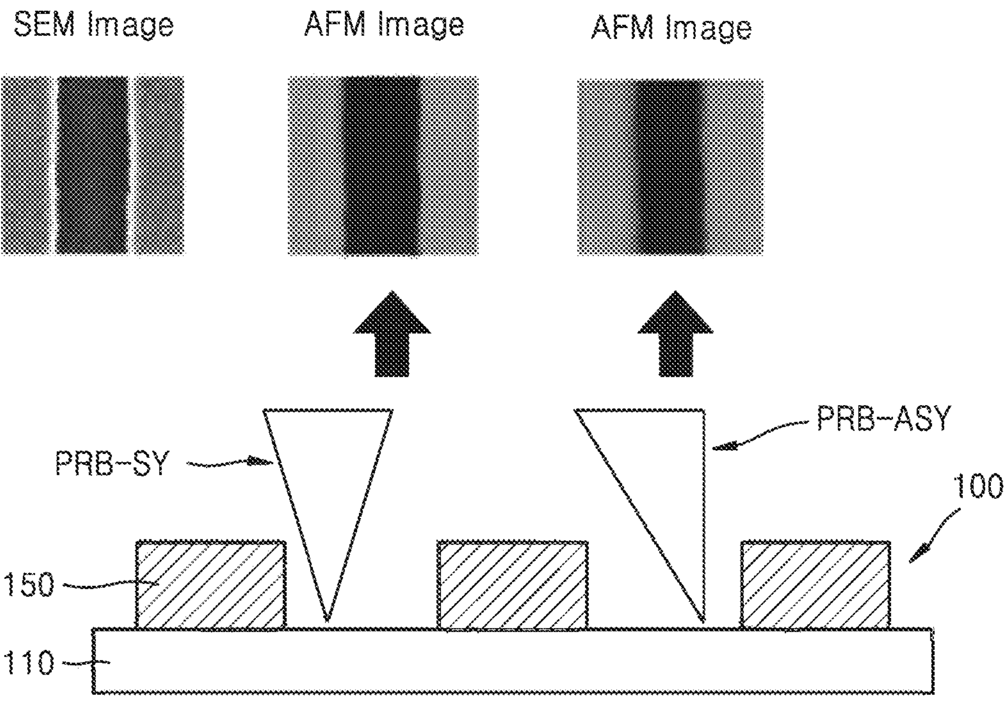

FIGS. 9A to 9C are conceptual diagrams illustrating probe characteristics of an AFM used in a method of removing a defect of a mask according to an embodiment of inventive concepts.

FIG. 9A compares an electron microscope (SEM) image (a) of the patterns 150 formed on the substrate 110 of the mask 100, an AFM image (b) of the patterns 150 formed on the substrate 110 of the mask 100 using a probe PRB-W having a small A/R, and an AFM image (c) of the patterns 150 formed on the substrate 110 of the mask 100 using a probe PRB-N having a large A/R.

When the patterns 150 formed on the substrate 110 of the mask 100 are scanned using the probe PRB-W having a small A/R, a portion reached by the probe PRB-W having a small A/R in the clear region, which is a lower portion where no pattern exists, may be reduced. Therefore, in the AFM image (b) of the patterns 150 formed on the substrate 110 of the mask 100 and scanned using the probe PRB-W having a small A/R, a dark region may be enlarged and a clear region may be reduced.

When the patterns 150 formed on the substrate 110 of the mask 100 are scanned using the probe PRB-N having a large A/R, a portion reached by the probe PRB-N having a high A/R in a clear region, which is a lower portion where no pattern exists, may be increased. Accordingly, the clear region of the AFM image (c) of the patterns 150 formed on the substrate 110 of the mask 100 using the probe PRB-N having a large A/R may be larger than that of the AFM image (b) of the patterns 150 formed on the substrate 110 of the mask 100 using the probe PRB-W having a small A/R.

Accordingly, the design-based reference image DRI-D reflecting the enlargement/reduction of dark and clear regions according to the A/R of the probe PRB may be generated by convolution of the probe profile PBP including probe characteristics regarding the A/R of the probe PRB and the design image DRD of the defect area.

FIG. 9B compares an SEM image (a) of the patterns 150 formed on the substrate 110 of the mask 100, an AFM image (b) of the patterns 150 formed on the substrate 110 of the mask 100 using a probe with low wear PRB-NE, and an AFM image (c) of the patterns 150 formed on the substrate 110 of the mask 100 using a probe with high wear PRB-DG.

When scanning the patterns 150 formed on the substrate 110 of the mask 100 using the probe with low wear PRB-NE, there may be no or little blurring at the edge of the patterns in the AFM image (b). When scanning the patterns 150 formed on the substrate 110 of the mask 100 using the probe with high wear PRB-DG, there may be blurring at the edge of the patterns in the AFM image (c).

In addition, in the AFM image (c), there may be damage to part of the probe with high wear PRB-DG that has a significant effect on scanning the edge of the patterns 150 corresponding to part of the edge of the patterns where blurring occurs or part where blurring occurs greatly.

Accordingly, the design-based reference image DRI-D reflecting the degree of blurring and the location where blurring occurs according to the degree of wear of the probe PRB may be generated by convolution of the design image DRD of the defect area and the probe profile PBP including probe characteristics regarding the degree of wear of the probe PRB.

FIG. 9C compares an SEM image (a) of the patterns 150 formed on the substrate 110 of the mask 100, an AFM image (b) of the patterns 150 formed on the substrate 110 of the mask 100 and scanned using a probe with symmetry PRB-SY, and an AFM image (c) of the patterns 150 formed on the substrate 110 of the mask 100 and scanned using a probe with asymmetry PRB-ASY.

When scanning the patterns 150 formed on the substrate 110 of the mask 100 using the probe with symmetry PRB-SY, edges of opposite sides of two adjacent patterns 150 may have substantially similar sharpness in the AFM image (b). However, when scanning the pattern 150 formed on the substrate 110 of the mask 100 using the probe with asymmetry PRB-ASY, edges of opposite sides of two adjacent patterns 150 may have different sharpness in the AFM image (c).

Accordingly, the design-based reference image DRI-D in which the difference in sharpness due to the asymmetry of the probe PRB is reflected at the edges of the patterns may be generated by convolution of the design image DRD of the defect area and the probe profile PBP including probe characteristics regarding the asymmetry of the probe PRB.

Figure 10:
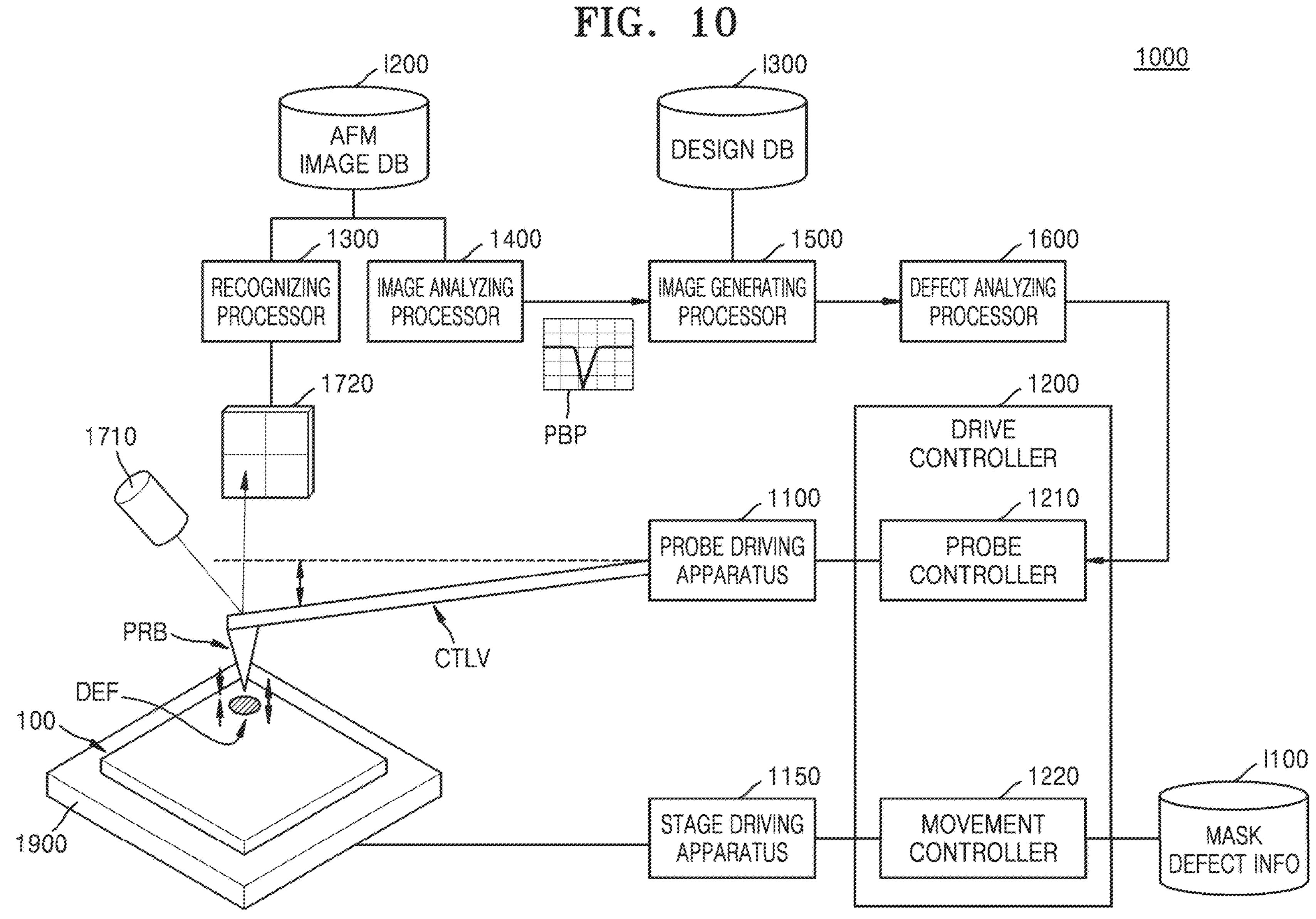
FIG. 10 is a schematic diagram illustrating a mask defect removal device for a method of removing a defect of a mask according to an embodiment of inventive concepts.

FIG. 10 is a schematic diagram illustrating a mask defect removal device for a method of removing a defect of a mask.

Referring to FIGS. 1 to 10, the mask defect removal device 1000 may include a stage 1900 on which the mask 100 is mounted, a cantilever CTLV, a probe PRB attached to one end of the cantilever CTRL, a laser 1710, and an AFM including a sensor 1720.

The AFM is a microscope used to shape the surface of a sample (atomic size, nanostructure unit) by measuring the action of force between atoms, or manipulate the arrangement of atoms or molecules on the surface of the sample by applying force to the cantilever CTLV. The cantilever CTLV may have a small rod shape, and the size of one end of the cantilever CTLV may be several nm to several μm. For example, the cantilever CTLV may include silicon or silicon nitride.

When the probe PRB attached to one end of the cantilever CTLV approaches the surface of the sample, for example, the pattern 150 included in the mask 100 or the surface of the defect DEF generated in the mask 100, a repulsive force or an attractive force may be generated between the probe PRB and the sample to bend the cantilever CTLV. When the cantilever CTLV is bent, the direction of the laser 1710 irradiated to the cantilever CTLV may be bent, and the direction of the laser 1710 may be detected by the sensor 1720 to detect the shape of the sample surface. For example, the sensor 1720 may be a position-sensitive photodiode (PSPD) including an image sensor.

For example, the cantilever CTLV may be bent by a Van Der Waals force generated between the probe PRB and the sample. The Van Der Waals force refers to a repulsive force or an attractive force between molecules or between polarizations within a molecule. When an instantaneous dipole is formed by the movement of electrons in a nonpolar molecule, the adjacent molecule also undergoes a temporary polarization to generate an induced dipole. The Van Der Waals force refers to an attractive force between the instantaneous dipole and the induced dipole. The Van Der Waals force acts as a repulsive force and an attractive force depending on the distance between the probe PRB attached to one end of the cantilever CTLV and the sample surface. For example, a repulsive force may act when the distance between the probe PRB and the sample surface is relatively short, and an attractive force may act when the distance between the probe PRB and the sample surface is relatively long.

The AFM may scan the sample in a contact mode, a non-contact mode, or a tapping mode. In the contact mode, the repulsive force may be dominant when the distance between the probe PRB and the sample surface is within several A. In the contact mode, the probe PRB may pass while substantially scratching the sample. In the non-contact mode, the attractive force may be dominant when the distance between the probe PRB and the sample surface is within several hundred Å to several thousand Å. In the non-contact mode, the probe PRB and the sample do not come into contact, and the scan speed may be high. In the tapping mode, the sample may be scanned while giving constant vibration to the probe PRB. In addition, the AFM may scan the sample in a constant height mode and a constant force mode. In the constant height mode, the AFM may scan while maintaining a constant distance (height in the vertical direction) between the probe PRB and the sample, so the scan speed may be fast. The constant force mode is a method of maintaining and measuring the force acting between the probe PRB and the sample at a constant level to control the force applied to the sample.

The AFM included in the mask defect removal device 1000 may be operated in different modes when removing a defect and when obtaining an AFM image, e.g., AFM image ORI of the offset calibration region OSR, AFM image DRI of the obtained defect area, AFM image after first defect removal DRI-RP, or AFM image after second defect removal DRI-CLN. For example, the AFM included in the mask defect removal device 1000 may operate in a non-contact mode or a tapping mode when obtaining the AFM image and operate in a contact mode when removing the defect DEF.

A probe driving apparatus 1100 may be connected to the other end of the cantilever CTLV. The probe driving apparatus 1100 may vibrate the probe PRB or drive the cantilever CTLV to adjust the vertical location, e.g., the height, of the probe PRB. A stage driving apparatus 1150 may move the stage 1900 on which the mask 100 is mounted so that the probe PRB scans the mask 100. The stage driving apparatus 1150 may move the stage 1900 horizontally and/or vertically. The probe driving apparatus 1100 and stage driving apparatus 1150 may include robotics operated under the controller of the drive controller 1200.

The recognizing processor 1300 may obtain, from information sensed by the sensor 1720, the AFM image, e.g., AFM image ORI of the offset calibration region OSR, AFM image DRI of the obtained defect area, AFM image after first defect removal DRI-RP, or AFM image after second defect removal DRI-CLN. An image analyzing processor 1400 may generate the probe profile PBP by analyzing the AFM image obtained by the recognizing processor 1300, e.g., the AFM image ORI of the offset calibration region OSR with reference to the AFM image DB 1200. An image generating processor 1500 may generate the design-based reference image DRI-D with reference to the design DB 1300 and the probe profile PB.

A defect analyzing processor 1600 may compare the obtained AFM image DRI of the defect area and the design-based reference image DRI-D, recognize the defect DEF-RE, and set the defect removal area DFR. Or the defect analyzing processor 1600 may perform defect removal evaluation by comparing the design-based reference image DRI-D with the AFM image after first defect removal DRI-RP and/or the AFM image after second defect removal DRI-CLN.

A drive controller 1200 may include a probe controller 1210 and a movement controller 1220, and the probe driving apparatus 1100 may be operated by the probe controller 1210, and the stage driving apparatus 1150 may be operated by the movement controller 1220. The probe controller 1210 may control the probe PRB to remove the defect DEF-RE recognized by the defect analyzing processor 1600. Referring to the mask defect information 1100, the movement controller 1220 may move the probe PRB to the location of the defect of the mask 100 where the defect DEF is located by operating the stage driving apparatus 1150, and cause the probe PRB to scan the defect area of the mask 100 including the location of the defect of the mask 100.

The mask defect removal device 1000 according to an embodiment of inventive concepts may perform scanning only once using the probe PRB of the AFM on the defect area of the mask 100 until the defect DEF is removed. Therefore, scanning using the probe PRB of the AFM, which takes a relatively long time, may be limited and/or minimized, and the time for removing the defect of the mask 100 may be shortened.

The mask defect removal device 1000 according to an embodiment of inventive concepts may precisely remove the defect DEF since the mask defect removal device 1000 may recognize and remove the defect DEF immediately after scanning the defect area of the mask 100 using the probe PRB of the AFM, without moving the probe PRB of the AFM to another area.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts have been particularly shown and described with reference to embodiments thereof, it will be understood that various changes in form and details may be made therein without departing from the spirit and scope of the following claims.

What is claimed is:

1. A method of removing a defect of a mask, the method comprising:

generating a probe profile, the probe profile including characteristics of a probe of an atomic force microscope (AFM);

generating a design-based reference image of a defect area by applying the probe profile to a design image of the defect area of the mask including a location of the defect;

obtaining an AFM image of the defect area by scanning the defect area of the mask using the probe of the AFM;

recognizing the defect as a recognized defect by comparing the AFM image of the defect area with the design-based reference image; and removing the recognized defect using the probe of the AFM.

2. The method of claim 1, further comprising:

calibrating an offset of the probe of the AFM by scanning an offset calibration region included in the mask using the probe of the AFM.

3. The method of claim 2, wherein in the calibrating the offset of the probe of the AFM, the AFM image of the offset calibration region is obtained by scanning the offset calibration region using the probe of the AFM, and the probe profile is generated by comparing the AFM image of the offset calibration region obtained in the calibrating the offset of the probe of the AFM with a design image of the offset calibration region.

4. The method of claim 3, wherein the design image of the defect area of the mask and the design image of the offset calibration region each are extracted from a mask layout in a graphic database II (GDSII) stream format.

5. The method of claim 1, wherein the characteristics of the probe included in the probe profile include a 3D image of the probe of the AFM, an aspect ratio of the probe of the AFM, a degree of wear of the probe of the AFM, and an asymmetry of the probe of the AFM.

6. The method of claim 1, wherein after obtaining the AFM image of the defect area, the recognized defect is removed using the probe of the AFM without moving the probe of the AFM to another area.

7. The method of claim 1, wherein in the recognizing the defect as the recognized defect, only one AFM image of the defect area obtained by scanning the defect area of the mask using the probe of the AFM is compared with the design-based reference image.

8. The method of claim 1, wherein the location of the defect is extracted from the location of the defect of a semiconductor wafer obtained through defect inspection of the semiconductor wafer where patterns are formed using the mask or the location of the defect is extracted from a location of a defect of the semiconductor wafer obtained through an electrical test for the semiconductor wafer where patterns are formed using the mask.

9. The method of claim 1, wherein the design-based reference image of the defect area is generated by a convolution of a design image of the defect area of the mask and the probe profile.

10. The method of claim 1, wherein during the removing the recognized defect using the probe of the AFM, the probe applies physical force to the recognized defect to remove the recognized defect.

11. The method of claim 1, wherein the mask comprises a substrate having a main exposure area and an offset calibration region, patterns on the substrate in the main exposure area, and a dummy pattern on the substrate in the offset calibration region, the defect area of the mask is positioned within the main exposure area, the offset calibration region of the mask includes a portion of an edge of the dummy pattern extending in a first horizontal direction and a portion of an edge of the dummy pattern extending in a second horizontal direction, and the second horizontal direction is orthogonal to the first horizontal direction.

12. A method of removing a defect of a mask, the method comprising:

scanning an offset calibration region included in a mask using a probe of an atomic force microscope (AFM) to obtain an AFM image of the offset calibration region and calibrating an offset of the probe of the AFM by adjusting a zero point;

generating a probe profile by comparing the AFM image of the offset calibration region with a design image of the offset calibration region, the probe profile including characteristics of the probe of the AFM;

generating a design-based reference image of a defect area by applying the probe profile to a design image of the defect area of the mask including a location of the defect;

obtaining an AFM image of the defect area by scanning the defect area of the mask using the probe of the AFM;

recognizing the defect as a recognized defect by comparing the AFM image of the defect area with the design-based reference image; and removing the recognized defect using the probe of the AFM.

13. The method of claim 12, wherein the characteristics of the probe included in the probe profile include information on an aspect ratio of the probe of the AFM, a degree of wear of the probe of the AFM, and an asymmetry of the probe of the AFM corresponding to a three-dimensional image of the probe.

14. The method of claim 13, wherein the mask includes a substrate having a main exposure area and the offset calibration region, patterns on the substrate in the main exposure area, and a dummy pattern on the substrate in the offset calibration region, the defect area is located on the main exposure area, the offset calibration region of the mask includes a corner portion of the dummy pattern where a portion of an edge extending in a first horizontal direction intersects with a portion of an edge extending in a second horizontal direction, and the second horizontal direction is orthogonal to the first horizontal direction.

15. The method of claim 14, wherein in the AFM image of the offset calibration region, the degree of wear of the probe of the AFM is obtained by comparing a degree of blurring occurring at the portion of the edge of the dummy pattern extending in the first horizontal direction with a degree of blurring occurring at the portion of the edge of the dummy pattern extending in the second horizontal direction.

16. The method of claim 12, wherein in the recognizing the defect as the recognized defect, only one AFM image of the defect area obtained by scanning the defect area of the mask using the probe of the AFM is compared with the design-based reference image.

17. The method of claim 16, wherein after obtaining the AFM image of the defect area, the recognized defect is removed by applying physical force to the recognized defect using the probe of the AFM without moving the probe of the AFM to another area.

18. The method of claim 12, wherein the design-based reference image of the defect area is generated by a convolution of the probe profile and the design image of the defect area of the mask.

19. A method of removing a defect of a mask, the method comprising:

preparing a mask including a substrate having a main exposure area and an offset calibration region, patterns on the substrate in the main exposure area, and a dummy pattern on the substrate in the offset calibration region;

obtaining an atomic force microscope (AFM) image of the offset calibration region by scanning the offset calibration region of the mask using a probe of an AFM, and calibrating the offset of the probe of the AFM by adjusting a zero point;

generating a probe profile by comparing the AFM image of the offset calibration region with a design image of the offset calibration region, the probe profile including characteristics of a probe of the AFM;

generating a design-based reference image of a defect area by a convolution of a design image of the defect area of the mask including a location of the defect and the probe profile;

obtaining an AFM image of the defect area by scanning the defect area of the mask using the probe of the AFM;

recognizing the defect as a recognized defect by comparing the AFM image of the defect area with the design-based reference image;

removing the recognized defect using the probe of the AFM; and performing a cleaning process on the mask.

20. The method of claim 19, wherein in the recognizing the defect, only one AFM image of the defect area obtained by scanning the defect area of the mask using the probe of the AFM is compared with the design-based reference image, after the obtaining the AFM image of the defect area, the recognized defect is removed using the probe of the AFM without moving the probe of the AFM to another area.

* * * * *